(12) United States Patent
Ma

(10) Patent No.: US 7,367,815 B2
(45) Date of Patent: May 6, 2008

(54) ELECTRICAL SOCKET

(75) Inventor: Hao-Yun Ma, Tu-Cheng (TW)

(73) Assignee: Hon Hai Precision Inc. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/810,264

(22) Filed: Jun. 5, 2007

(65) Prior Publication Data

US 2007/0281514 A1    Dec. 6, 2007

(30) Foreign Application Priority Data

Jun. 5, 2006    (TW) ............................... 95209719 U

(51) Int. Cl.
*H01R 12/00* (2006.01)

(52) U.S. Cl. ...................................... 439/71
(58) Field of Classification Search .................. 439/71, 439/342, 66, 246
See application file for complete search history.

(56) References Cited

U.S. PATENT DOCUMENTS 6,164,978 A * 12/2000 McHugh et al. ............... 439/66
6,196,849 B1 * 3/2001 Goodwin ...................... 439/71
6,203,331 B1 * 3/2001 McHugh et al. ............... 439/71
6,413,111 B1 * 7/2002 Pickles et al. ............... 439/342
6,533,592 B1 * 3/2003 Chen et al. .................. 439/135
6,554,625 B1 * 4/2003 Liao et al. ................... 439/135
6,570,763 B1 * 5/2003 McHugh et al. ............. 361/704
6,685,494 B1 * 2/2004 McHugh et al. ............. 439/342
6,811,421 B1 * 11/2004 Gattuso et al. .............. 439/266
2007/0281508 A1 * 12/2007 Liao et al. ...................... 439/71

* cited by examiner

*Primary Examiner*—Michael C. Zarroli
*Assistant Examiner*—Phuongchi Nguyen
(74) *Attorney, Agent, or Firm*—Wei Te Chung

(57) ABSTRACT

An electrical comprises a base, and a plurality of contacts received in the base. The base defines a mating interface, a mounting interface opposite to the mating interface, and a plurality of passageways arranged between the mating interface and the mounting interface so as to receive the contacts. The base further defines peripheral edges, and each edge defines at least one positioning member extending upwardly from the mating interface along the peripheral edges, said positioning members seated around region having contacts so as to define a receiving cavity adapted to have an CPU module received therein jointly with the mating interface.

1 Claim, 5 Drawing Sheets

ELECTRICAL SOCKET

BACKGROUND OF THE INVENTION

1. Field of the Invention

The present invention relates generally to an electrical connector, and more particularly relates to an electrical connector having insulative housing with simple structure.

2. Background of the Invention

Electrical connectors have been widely used for electrically connecting two electrical interfaces such as an electrical substrate, e.g. a PCB, and an integrated circuit (IC) package, e.g. a central processing unit (CPU) module. Electrical connectors generally comprising an insulative housing, and a plurality of contacts received in the housing for electrically connected with said two electrical interfaces.

U.S. Pat. No. 6,877,990 issued to Liao on Apr. 12, 2005 discloses an electrical connector comprising an insulative housing, and a number of contacts received in the housing. The insulative housing defines a mating interface with peripheral sidewalls extending therefrom so as to define a receiving cavity adapted to have a CPU module received therein. Two opposite sidewalls each define a small opening ensuring the CPU module detaching from the cavity easily. However, Liao's housing is too complicated to implement.

U.S. Pat. No. 7,044,746 issued to Copper on May 16, 2005 disclosed a socket assembly 10, which has been applied to industry, including base 14 and peripheral walls 12 extending upwardly from the base 14 that define an inner cavity 14. Spring contacts are positioned in the receptacle formed in base. As shown in FIG. 1 of the patent, peripheral walls form continuous sidewalls such that form the inner cavity 14 jointly with the base. However, Copper's device is also too complicated to implement.

U.S. Pat. No. 6,527,597 issued to Harber on Mar. 4, 2003 disclose typical type of electrical connector for establishing electrical connecting between two electrical interfaces. As shown in FIG. 3 of this patent, Harber disclosed an electrical connector comprising several connectors 100. Each connector 100 defines a wall 115 around a portion of its periphery, so that when said several connector 100 modules are fully assembled, the walls 115 form an enclosure around the periphery of the connector 100. The walls 115 have keying features 117 for mating with another connector. Actually, the keying features 117 are openings arranged on the walls 115 in a preferred embodiment disclosed by Harber. However, such electrical connector disclosed by Harber is too complicated to implement.

As such, there is a room for providing a design for electrical connector met the requirement from the industry.

SUMMARY OF THE INVENTION

An electrical comprises a base, and a plurality of contacts received in the base. The base defines a mating interface, a mounting interface opposite to the mating interface, and a plurality of passageways arranged between the mating interface and the mounting interface so as to receive the contacts. The base further defines peripheral edges, and each edge defines at least one positioning member extending upwardly from the mating interface along the peripheral edges, said positioning members seated around region having contacts so as to define a receiving cavity adapted to have an CPU module received therein jointly with the mating interface.

DETAILED DESCRIPTION OF THE PREFERRED EMBODIMENT OF THE INVENTION

Hereinafter, the present invention will be described in detail with reference to the accompanying drawings.

Figure 1:
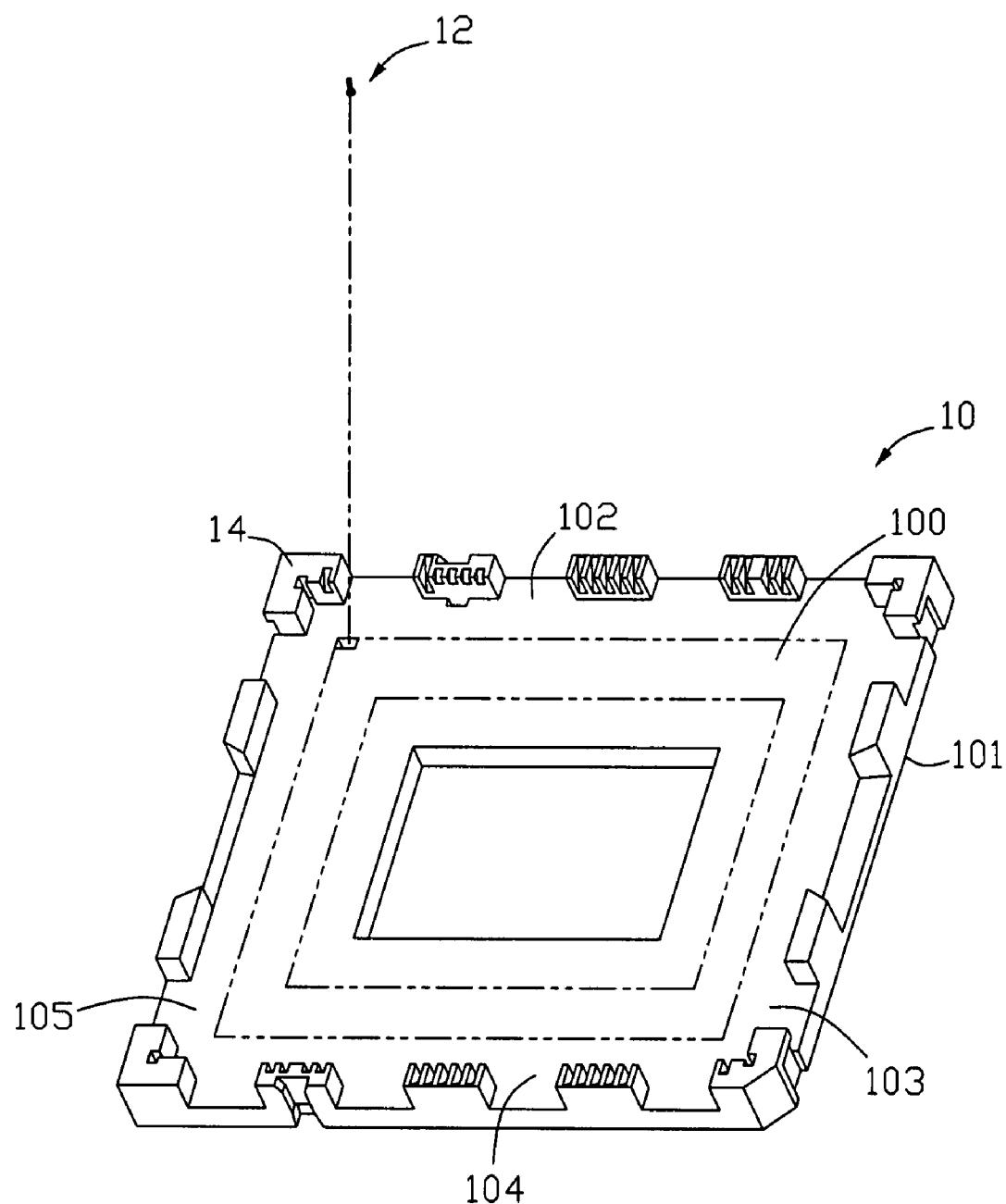
FIG. 1 illustrates an isometric view of an electrical connector in accordance with a preferred embodiment of the present invention.

Referring to FIG. 1, an electrical connector 1 according to the present invention comprises an insulative base 10, and a plurality of contacts 12 received in the base 10. The base 10 defines a mating interface 100, a mounting interface 101 opposite to the mating interface 100, and a plurality of passageways (not labeled) arranged between the mating interface 100 and the mounting interface 101 for receiving corresponding contacts 12.

The base 10 defines peripheral edges, said peripheral edges comprising a first edge 102, a second edge 103 adjacent to the first edge 102, a third edge 104 opposite to the first edge 102, and a fourth edge 105 opposite to the second edge 103. Each edge defines at least one positioning member 14 extending upwardly from the mating interface 100 along said peripheral edges, said positioning members 14 seated around region having contacts 12 so as to define a receiving cavity adapted to have an CPU module (not shown) received therein jointly with the mating interface 100. Some positioning members 14 are arranged on corner defined by two adjacent edges and located simultaneously on said two adjacent edges. All positioning members 14 form an incontinuous wall with a plurality of openings thereon. When the CPU module mates with the mating interface 100, the positioning members abut against the CPU module so as to ensure the CPU to be located on the mating interface 100. Accordingly, the insulative housing 10 has a lower cost and is easily to implement.

Figure 2:
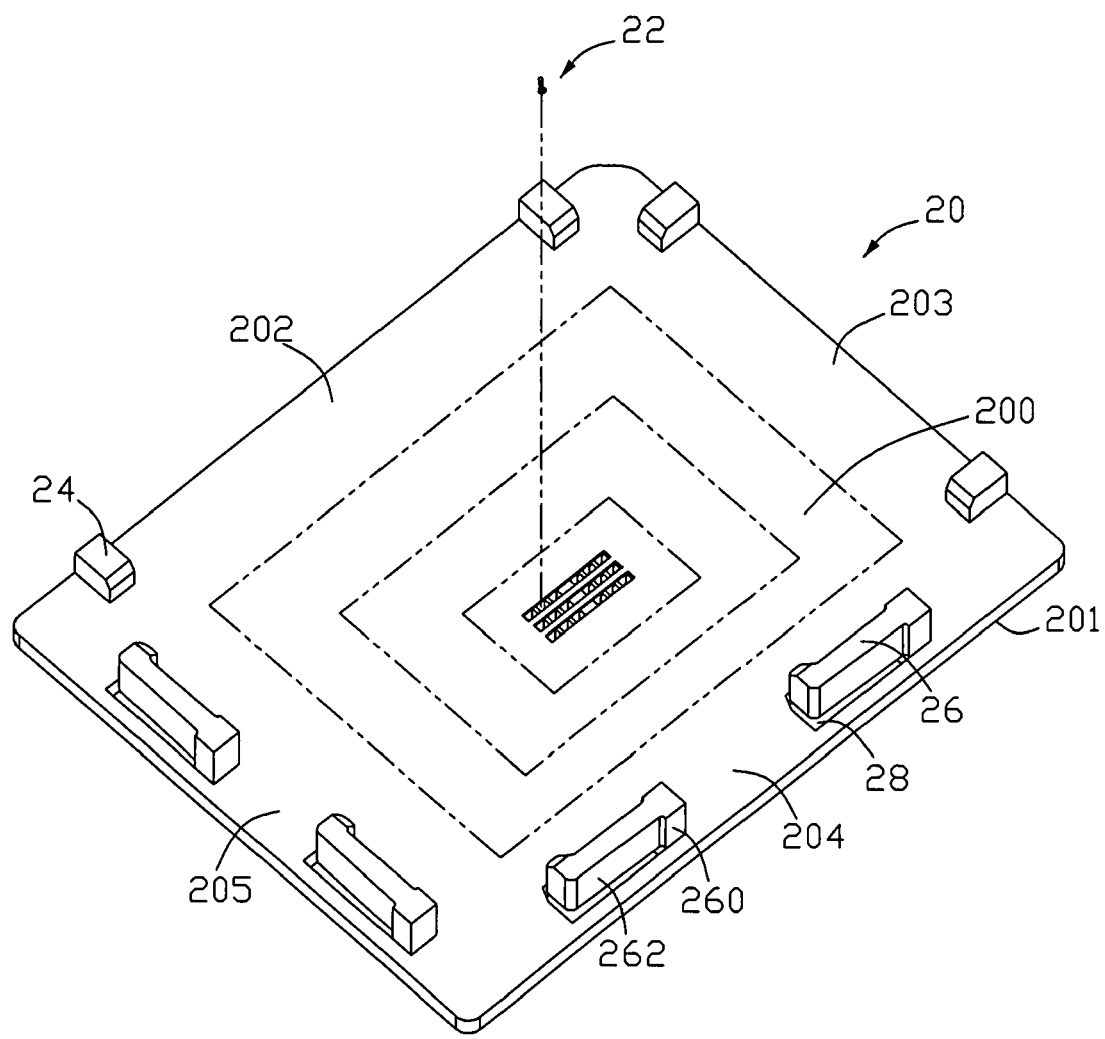
FIG. 2 illustrates an isometric view of an electrical connector in accordance with a second preferred embodiment of the present invention.
Figure 3:
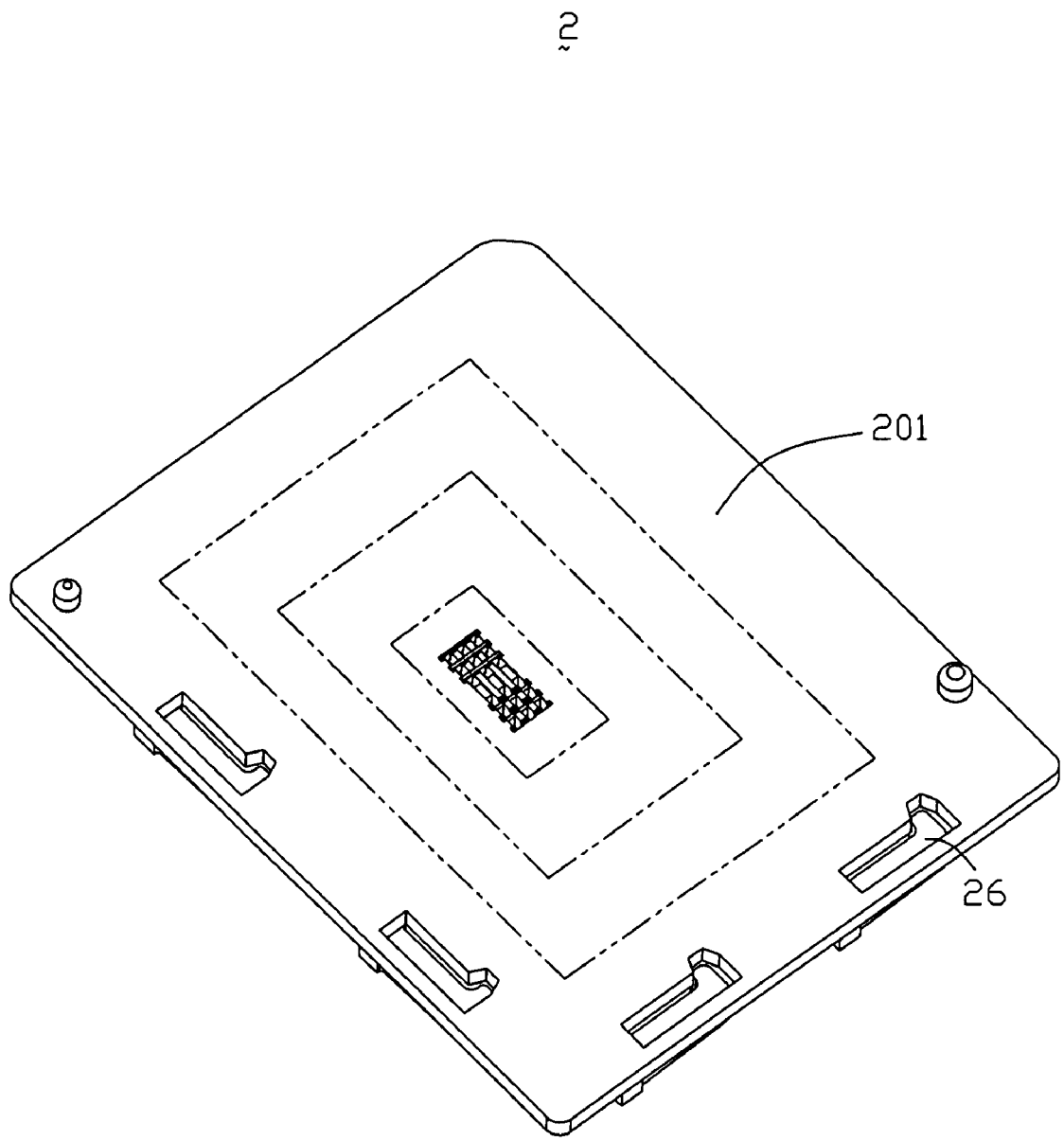
FIG. 3 is an isometric view of an electrical connector according to a third preferred embodiment of the present invention.

FIGS. 2-3 depict an electrical connector 2 according to a second preferred embodiment of the present invention. The electrical connector 2 comprises an insulative base 20, and a number of contacts 22 received in the base 20.

The insulative base 20 defines a mating interface 200 adapted to have a CPU module (not shown) mounted thereon, a mounting interface 201 mountable on a circuit board (not shown) and a plurality of passageways (not labeled) extending from the mating interface 200 toward the mounting interface 201. The base 20 defines a first edge 202, a second edge 203 adjacent to and interconnected with first edge 202, a third edge 204 opposite to the first edge 202, and a fourth edge 205 opposite to the second edge 203 and interconnected with the second and third edge.

The first edge 202 and second edge 203 each define at least one stationary pillar 24, and the third 204 and fourth edge 205 each define at least one movable push finger 26. The plurality of stationary pillars 24 is called a first group of positioning member, and the plurality of movable push fingers 26 is called a second group of positioning member. The pillars 24 each extend upwardly from the mating interface 200 along said first and second edge, and the push fingers 26 each extend upwardly form the mating interface 200 along said third and fourth edge. The push finger 26 comprises a base portion 260 extending upwardly from the mating interface 200, and an arm 262 extending from the base portion 260 along said edges. The base 20 defines a plurality of openings 28 corresponding to the arm 262 of the push finger 26 such that the arm 262 has a reliable flexibility. When the CPU module mates with the connector 2, the push fingers 26 exert a resilient force on the CPU module so as to ensure the CPU module to be located with the connector jointly with the pillars 24. Additionally, the base 20 has a number of standoffs extending from the mounting interface 201 for positioning the base 20 on a circuit board.

As shown in FIG. 2, one of the pillars 24 located in the first edge 202 is arranged adjacent to corner defined by the first and second edge; and one of the pillars located in the second edge 203 is arranged adjacent to the corner define by the first and second edge, too. Also, one of the movable push fingers 26 located in said third edge 204 is arranged adjacent to corner defined by the third and fourth edge; and one of the movable push fingers 26 located in said fourth edge 205 is arranged adjacent to the corner defined by the third and fourth edge.

As set forth forgoing, said positioning members 24, 26 form a receiving cavity adapted to have an CPU module (not shown) received therein jointly with the mating interface 200. Compare to insulative housing of the prior art, the base 20 of the present invention is of a simple structure and easily to implement.

Figure 4:
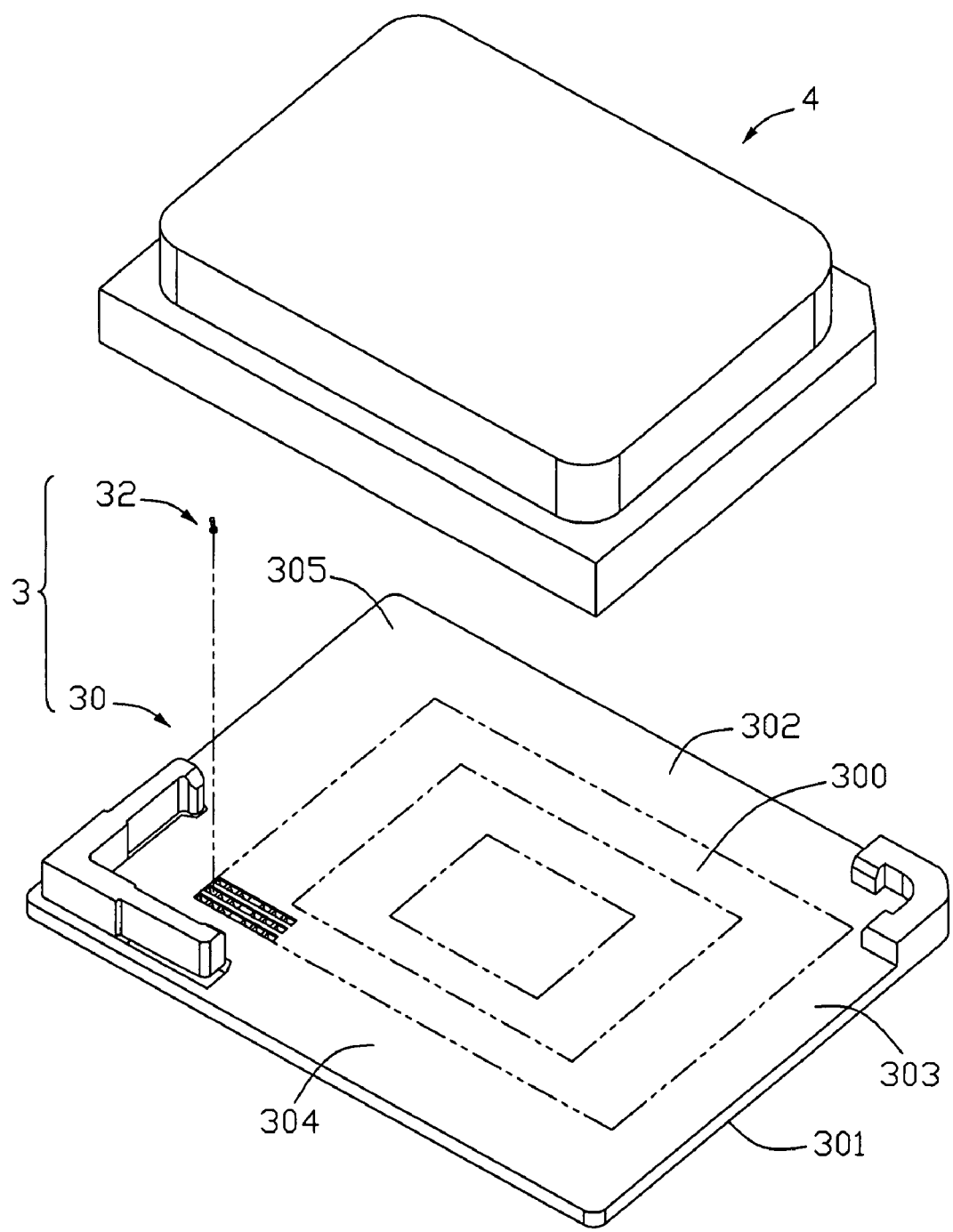
FIG. 4 is a bottom view of an electrical connector according to an embodiment of the present invention, together with a CPU module ready to be mated with the connector.
Figure 5:
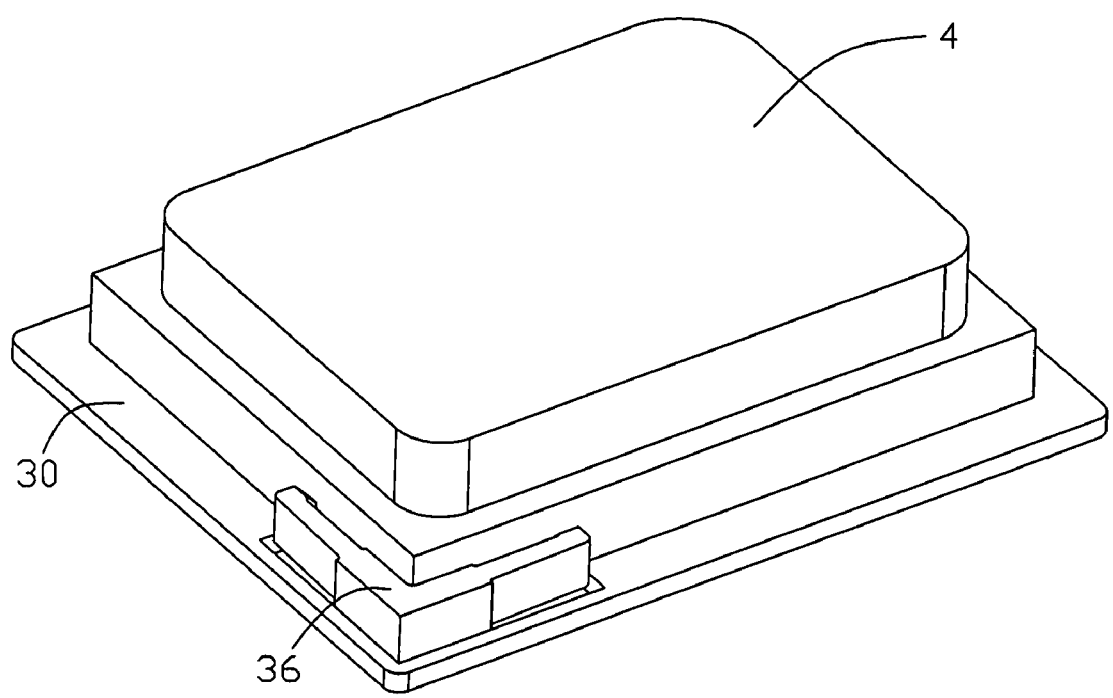
FIG. 5 depicts an assembly view of an electrical connector mating with a CPU module according to a preferred embodiment of the present invention.

An electrical connector 3 according to a third preferred embodiment of the present invention is shown in FIGS. 4-5. The electrical connector 3 comprises an insulative base 30, and a number of contacts 32 received in the base 30.

The base 30 defines a mating interface 300, a mounting interface 301 opposite to the mating interface 300, and a plurality of passageways (not labeled) extending from the mating interface 300 toward the mounting interface 301, the base 30 further defining peripheral edges.

Said peripheral edges comprises a first edge 302, a second edge 303 adjacent to the first edge 302, a third edge 304 opposite to the first edge 302, and a fourth edge 305 opposite to the second edge 303. A first group of positioning member 34 is arranged on a corner defined by said first and second edge and located simultaneously on the said two adjacent edges; and a second group of positioning member 36 is arranged on a diagonal corner defined by the third and fourth adjacent edges and located simultaneously on said two adjacent edges. The first group of positioning member 34 is a stationary pillar extending upwardly from the mating interface 300 along the edges. The first group of positioning member 34 is generally of an "L" shape. The second group of positioning member 36 is a movable push finger extending upwardly from the mating interface 300 along the third and fourth edges. The second group of positioning 36 is generally of an "L" shape.

As mentioned above, the electrical connector 3 according to the third preferred embodiment of the present invention defines a base 30 having two groups of positioning members extending therefrom, said two positioning members located in corner defined by two adjacent edges of the base 30. Said two groups of positioning members 34, 36 define a receiving cavity adapted to have a CPU module 4 received therein jointly with the mating interface 300. Compare to insulative housing disclosed in the prior art, there is no need a sidewall to be arranged in the base 30 of the present invention. Accordingly, the base 30 according to the present invention is easily to implement.

Although the present invention has been described with reference to particular embodiments, it is not to be construed as being limited thereto. Various alterations and modifications can be made to the embodiments without in any way departing from the scope or spirit of the present invention as defined in the appended claims.

I claim:
1. An electrical connector comprising:
   a base defining a mating interface and a mounting interface opposite to the mating interface, said base defining a plurality of passageways extending from the mating interface toward the mounting interface, said base further defining peripheral edge regions on said mating interface;
   a plurality of contacts, each of the contacts received in a corresponding passageways; and
   a first group of discrete positioning members being arranged on adjacent two of said edge regions, and a second group of discrete positioning member being arranged on other adjacent two of said edge regions; wherein
   said first group of positioning members are stationary pillars extending upwardly from the mating interface; wherein
   said second group of the positioning members are movable push fingers extending on the mating interface; wherein
   said first and second groups of positioning members commonly defined a receiving cavity adapted to have a CPU module received therein jointly with the mating interface; wherein
   said second group of positioning members are adapted to urge the CPU module toward the first group of corresponding positioning members; wherein
   no continuous peripheral wall extends upwardly on the peripheral edge regions to enclose the receiving cavity but with the first and second groups of discrete positioning members formed on the peripheral regions and extending above said mating interface and facing said receiving cavity.

* * * * *